US00RE48273E

(19) United States
(12) Reissued Patent
Song et al.

(10) Patent Number: US RE48,273 E
(45) Date of Reissued Patent: Oct. 20, 2020

(54) FLEXIBLE IMAGE DISPLAY DEVICE

(71) Applicant: DONGWOO FINE-CHEM CO., LTD., Jeollabuk-do (KR)

(72) Inventors: Byung Hoon Song, Gyeonggi-do (KR); In Kyu Song, Gyeonggi-do (KR)

(73) Assignee: DONGWOO FINE-CHEM CO., LTD., Jeollabuk-Do (KR)

(21) Appl. No.: 16/257,321

(22) Filed: Jan. 25, 2019

Related U.S. Patent Documents

Reissue of:
(64) Patent No.: 10,078,388
Issued: Sep. 18, 2018
Appl. No.: 15/356,728
Filed: Nov. 21, 2016

(30) Foreign Application Priority Data

Nov. 20, 2015 (KR) ..... 10-2015-0163452

(51) Int. Cl.

| | |
|---|---|
| ***G06F 3/041*** | (2006.01) |
| ***H01L 27/32*** | (2006.01) |
| ***H01L 51/52*** | (2006.01) |
| ***H01L 51/00*** | (2006.01) |
| ***G06F 3/044*** | (2006.01) |

(52) U.S. Cl.
CPC ..... *H01L 51/5281* (2013.01); *G06F 3/044* (2013.01); *G06F 3/0412* (2013.01); *H01L 27/323* (2013.01); *H01L 51/0097* (2013.01); *H01L 51/5293* (2013.01); *G06F 2203/04102* (2013.01); *G06F 2203/04103* (2013.01); *G06F 2203/04111* (2013.01); *H01L 2251/5338* (2013.01); *Y02E 10/549* (2013.01)

(58) Field of Classification Search
CPC ..... H01L 51/0097
See application file for complete search history.

(56) References Cited

U.S. PATENT DOCUMENTS

| | | | | |
|---|---|---|---|---|
| 7,486,017 | B2 * | 2/2009 | Ohkubo | H01L 51/5253 313/483 |
| 8,237,165 | B2 * | 8/2012 | Kim | H01L 27/3244 257/59 |
| 9,029,846 | B2 * | 5/2015 | Song | H01L 51/0097 257/40 |

(Continued)

FOREIGN PATENT DOCUMENTS

| | | | |
|---|---|---|---|
| KR | 2014-0120510 | A | 10/2014 |
| KR | 10-2014-0141380 | A | 12/2014 |

(Continued)

OTHER PUBLICATIONS

Korean Intellectual Property Office, "Written Opinion of Application 10-2015-0163452", dated Oct. 24, 2019. (Year: 2019).*

*Primary Examiner* — Luke S Wassum
(74) *Attorney, Agent, or Firm* — The PL Law Group, PLLC

(57) ABSTRACT

A flexible image display device includes a window substrate, a polarizing plate, and a touch panel, wherein a distance between a neutral plane and a lower surface of the touch panel based on a visible side during bending is 34% or less to an entire thickness of the flexible image display device. The flexible image display device has excellent flexibility and may significantly reduce a defect rate due to a damage of the touch panel by minimizing the damage of the touch panel even if repeatedly applying bending fatigue thereto.

12 Claims, 3 Drawing Sheets

(56) References Cited

U.S. PATENT DOCUMENTS 9,116,380 B2 * 8/2015 Nashiki ..... G06F 3/044
9,207,482 B2 * 12/2015 Nashiki ..... G02F 1/13338
9,768,328 B2 * 9/2017 Komatsu ..... H01L 31/0392
9,977,468 B2 * 5/2018 Kim ..... G06F 1/1656
10,135,024 B2 * 11/2018 Lee ..... H01L 51/0097
10,423,257 B2 * 9/2019 Song ..... G06F 3/0412
10,504,971 B2 * 12/2019 Yang ..... H01L 51/0097
2006/0028128 A1 * 2/2006 Ohkubo ..... H01L 51/5253
313/506
2010/0265207 A1 * 10/2010 Chen ..... G06F 3/0412
345/174
2011/0229730 A1 * 9/2011 Yosomiya ..... B32B 27/08
428/500
2013/0258570 A1 * 10/2013 Nashiki ..... G06F 3/044
361/679.01
2014/0036170 A1 * 2/2014 Nashiki ..... G06F 3/03
349/12
2014/0049699 A1 * 2/2014 Huang ..... G02B 5/3016
349/12
2014/0367644 A1 * 12/2014 Song ..... H01L 51/5256
257/40
2015/0207102 A1 * 7/2015 Jeong ..... H01L 27/323
257/40
2016/0084994 A1 * 3/2016 Namkung ..... G02B 1/14
345/173
2016/0137787 A1 * 5/2016 Oka ..... C08G 73/1007
524/600
2016/0155967 A1 * 6/2016 Lee ..... H01L 51/5281
257/88
2016/0336537 A1 * 11/2016 Tsuruoka ..... H01L 51/0097
2017/0062742 A1 * 3/2017 Kim ..... H01L 51/0097
2017/0084673 A1 * 3/2017 Lee ..... H01L 27/3244
2017/0335038 A1 * 11/2017 Li ..... C08L 53/02
2018/0155511 A1 * 6/2018 Takeda ..... H01L 51/5281
2018/0186935 A1 * 7/2018 Komatsu ..... B32B 15/088
2018/0337354 A1 * 11/2018 Sonoda ..... H01L 51/5253
2018/0375056 A1 * 12/2018 Sonoda ..... H01L 51/529

FOREIGN PATENT DOCUMENTS

KR 10-2015-0087284 * 6/2015 ..... G09F 9/30
KR 10-2015-0084257 A 7/2015
KR 10-2015-0084260 A 7/2015
WO WO 2013/021942 A1 * 2/2013 ..... H01B 3/30
WO WO 2016/085182 A1 * 6/2016 ..... G09F 9/30

* cited by examiner

FLEXIBLE IMAGE DISPLAY DEVICE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

This application claims the priority of Korean Patent Application No. 10-2015-0163452 filed on Nov. 20, 2015, in the Korean Intellectual Property Office, the disclosure of which is incorporated herein by reference.

BACKGROUND OF THE INVENTION

1. Field of the Invention

The present invention relates to a flexible image display device.

2. Description of the Related Art

Generally, a flexible image display device is a device in which a display part is formed on a flexible substrate to add flexibility thereto, and has a very useful advantage of being able to be used by bending a shape thereof as necessary.

Meanwhile, recently, almost all display devices tend to be configured to be operated by a touch operation of a user. For this, the flexible image display device is provided with a flexible touch panel capable of being flexibly bent, similar to a main body.

However, since a wiring layer made of a conductive material such as indium-tin-oxide (ITO) is formed in the flexible touch panel, there have been a lot of cases of cracks occurring in the wiring layer during an operation of bending the flexible touch panel.

That is, when bending the flexible image display device, there have frequently been cases of cracks occurring due to the wiring layer of the touch screen panel having a relatively low flexibility such that it could not stand a deformation thereof.

Thereby, in severe cases, the wiring layer is broken, resulting in a driving failure. Therefore, in order to prevent an occurrence of failure in a product, measures to resolve the above-described problem are required.

Korean Patent Laid-Open Publication No. 2014-0120510 discloses a flexible substrate, a flexible image display device, and a method of manufacturing the same, however, it did not suggest an alternative idea to solve the above-described problems.

SUMMARY

It is an aspect of the present invention to provide a flexible image display device capable of preventing an occurrence of curved cracks in a touch panel.

The above aspect of the present invention will be achieved by the following characteristics:

(1) A flexible image display device including: a window substrate, a polarizing plate, and a touch panel, wherein a distance between a neutral plane and a lower surface of the touch panel based on a visible side during bending is 34% or less to an entire thickness of the flexible image display device.

(2) The flexible image display device according to the above (1), further including a display panel disposed on a side opposite to the window substrate based on the polarizing plate and the touch panel.

(3) The flexible image display device according to the above (2), wherein a thickness between an upper surface of the window substrate and a lower surface of the display panel is 500 μm or less.

(4) The flexible image display device according to the above (2), wherein they window substrate has a thickness thicker than a total thickness of the polarizing plate, the touch panel and the display panel, and an elastic modulus larger than an elastic modulus of a laminate of the polarizing plate, the touch panel and the display panel.

(5) The flexible image display device according to the above (2), wherein the window substrate, the touch panel and the display panel have an elastic modulus of 2 GPa to 7 GPa, respectively, and the polarizing plate has an elastic modulus of 7 GPa or less.

(6) The flexible image display device according to the above (2), wherein optical clear adhesive layers are located between the window substrate and the polarizing plate, and between the touch panel and the display panel.

(7) The flexible image display device according to the above (1), wherein a substrates of the touch panel has a toughness of 2,000 Mpa % or more.

(8) The flexible image display device according to the above (1), wherein the touch panel satisfies Equation 1 below:

$$(\text{Toughness of touch panel substrate/Stress applied to the touch panel during bending}) \geq 9\% \quad \text{[Equation 1]}$$

(wherein the stress is a stress applied to the touch panel when bending the flexible image display device with a radius of curvature of 2.5 mm at a speed of 40 times/minute at room temperature by repeating 300,000 times).

(9) The flexible image display device according to the above (2), wherein the window substrate, the polarizing plate, the touch panel and the display panel are laminated in this order.

(10) The flexible image display device according to the above (9), wherein the substrate of the touch panel has a front retardation of ±2.5 nm or less.

(11) The flexible image display device according to the above (2), wherein the window substrate, the touch panel, the polarizing plate and the display panel are laminated in this order.

The flexible image display device of the present invention has excellent flexibility and may minimize a damage of the touch panel even if repeatedly applying bending fatigue thereto. Thereby, a defect rate due to the damage of the touch panel may be significantly reduced.

BRIEF DESCRIPTION OF THE DRAWING

The above and other objects, features and other advantages of the present invention will be more clearly understood from the following detailed description taken in conjunction with the accompanying drawings, in which.

DETAILED DESCRIPTION

Figure 1:
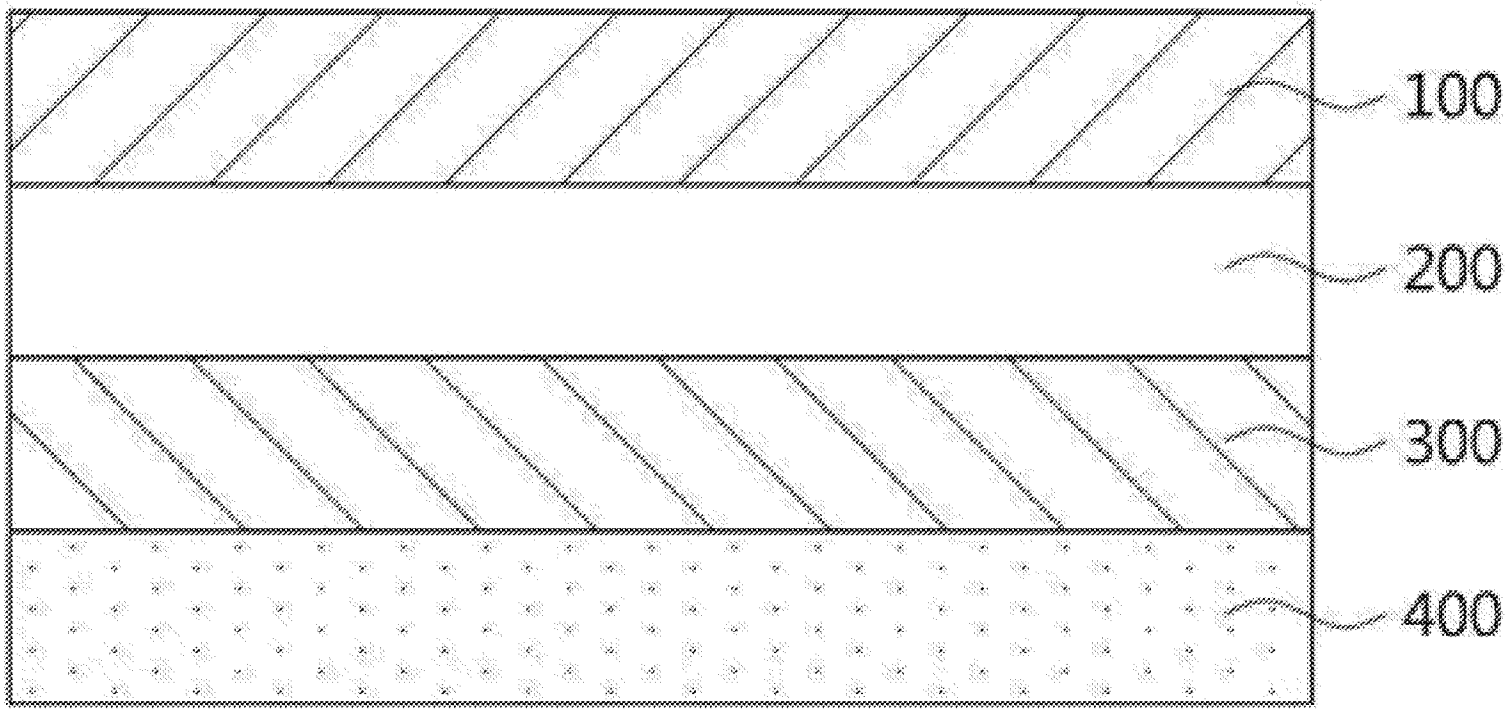
FIG. 1 is a schematic cross-sectional view of a flexible image display device according to an embodiment of the present invention.

The present invention discloses a flexible image display device including: a window substrate, a polarizing plate, and a touch panel, wherein a distance between a neutral plane and a lower surface of the touch panel based on a visible side during bending is 34% or less to an entire thickness of the flexible image display device. Thereby, the flexible image display device has excellent flexibility and may significantly reduce a defect rate due to a damage of the touch panel by minimizing the damage of the touch panel even if repeatedly applying bending fatigue thereto.

Hereinafter, the present invention will be described in detail.

A flexible image display device of the present invention includes a window substrate 100, a polarizing plate 300, and a touch panel 200, wherein a distance between a neutral plane and a lower surface of the touch panel 200 based on a visible side during bending is 34% or less to an entire thickness of the flexible image display device.

The window substrate 100 is not made of a rigid material such as a conventional glass, and preferably, is made of a transparent material having flexible properties, for example, a material such as polymethyl methacrylate (PMMA), acryl, polyester (PET), polyimide (PI), or the like.

The window substrate 100 has, for example, an elastic modulus of 2 GPa to 7 GPa, preferably, 2.3 GPa to 6 GPa, and more preferably, 5 GPa to 6 GPa. If the elastic modulus thereof is less than 2 GPa, it is difficult to achieve a high pencil hardness to cause a difficulty in sufficiently protecting the display panel. If the elastic modulus thereof exceeds 7 GPa, flexibility thereof may be decreased.

A thickness of the window substrate 100 is not particularly limited and may be, for example, 40 to 150 μm. If the thickness thereof is less than 40 μm, it is difficult to achieve a high pencil hardness to cause a difficulty in sufficiently protecting the display panel. If the thickness thereof exceeds 150 μm, the thickness is increased, such that bending properties in a small radius may not be satisfied.

The flexible image display device of the present invention may further include a display panel 400. Hereinafter, an embodiment in a case of further including the display panel 400 will be described, but it is not limited thereto.

Also, the display panel 400 is a display panel having flexible properties, and may be implemented as an organic electroluminescence display panel.

As an example, the organic electroluminescence display panel is a self-emitting device, and does not need to include a backlight unit unlike the existing liquid crystal display panel. Therefore, by using polyimide (PI), polycarbonate (PC), polyethersulphone (PES), polyethylene terephthalate (PET), polyethylenenaphthalate (PEN), polyarylate (PAR) fiber glass reinforced plastic (FRP), or the like, the display panel 400 may have flexible properties.

The display panel 400 may have an elastic modulus of 2 GPa to 7 GPa, and preferably, 2.5 GPa to 6 GPa. If the elastic modulus thereof is less than 2 GPa, luminescence performance may be deteriorated or the display device may be aged due to transmittance of oxygen or water vapor resulting from the increased gas permeability. If the elastic modulus exceeds 7 GPa, flexibility thereof may be decreased.

A thickness of the display panel 400 is not particularly limited and may be, for example, 20 to 40 μm. If the thickness thereof is less than 20 μm, luminescence performance may be deteriorated or the display device may be aged due to transmittance of oxygen or water vapor resulting from the increased gas permeability. If the thickness thereof exceeds 40 μm, flexibility thereof may be decreased to cause failure of the display device during bending.

The polarizing plate 300 and the touch panel 200 may be disposed between the window substrate 100 and the display panel 400.

Figure 3:
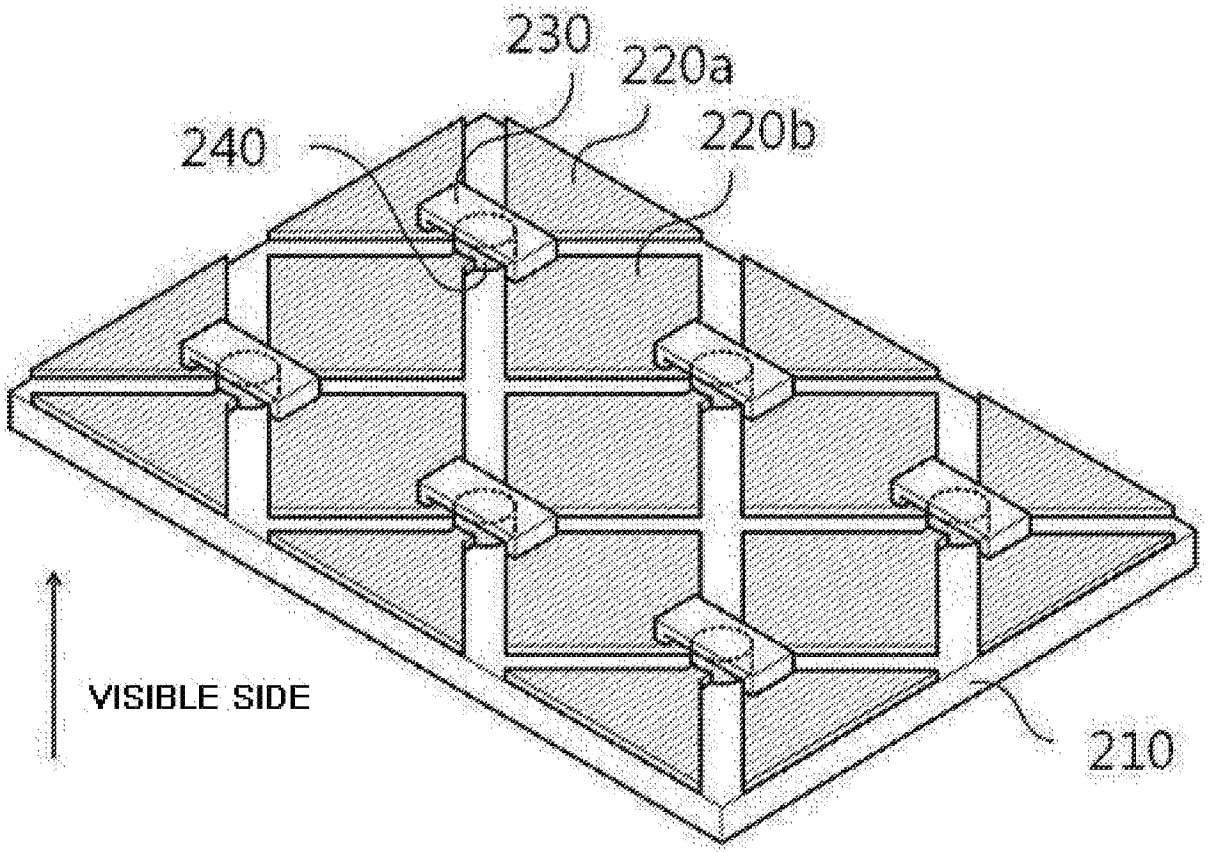
FIG. 3 is a schematic plan view of a touch panel in the flexible image display device according to the embodiment of the present invention during bending.

FIG. 3 is a plan view of the touch panel 200 according to the embodiment of the present invention.

The touch panel 200 is classified into an active area (AA) and a non-active area (NA) located at an outer portion of the active area. The active area is an area corresponding to an area (display part) in which an image is displayed in the display panel 400, and an area of detecting touch of a user. The non-active area is an area corresponding to an area (non-display part) in which the image is not displayed in the display device. FIG. 3 illustrates only the active area as an example.

The touch panel 200 may include: a substrate 210 having flexible properties; a sensing pattern 220 formed in the active area of the substrate 210; and sensing lines (not illustrated) which are formed in the non-active area of the substrate 210 to connect the sensing pattern 220 with an external driving circuit (not illustrated) through a pad part (not illustrated).

The substrate 210 having flexible properties may include, for example, polyester films such as polyethylene terephthalate, polyethylene isophthalate, polybutylene terephthalate, etc.; cellulose films such as diacetylocellulose, triacetylcellulose, etc.; polycarbonate films; acryl films such as polymethyl (meth)aerylate, polyethyl (meth)acrylate, etc.; styrene films such as polystyrene, acrylonitrile-styrene copolymer, etc.; polyolefin films such as cycloolefin, cycloolefin copolymer, polynorbornene, polypropylene, polyethylene, ethylene-propylene copolymer, etc.; vinyl chloride films; polyamide films such as nylon, aromatic polyamide, etc.; polyimide films; sulfone films; polyetherketone films; polyphenylene sulfide films; vinyl alcohol films; vinylidene chloride films; vinyl butyral films; allylate films; polyoxymethylene films; urethane films; epoxy films; silicon films, and the like.

It is preferable that a substrate of the touch panel 200 has a toughness of 2,000 Mpa % or more, in terms of suppressing cracks in the touch panel 200. More preferably, the substrate may have a toughness of 2,000 MPa % to 30,000 MPa %.

The sensing pattern 220 may include a first pattern 220a formed in a first direction and a second pattern 220b formed in a second direction, as illustrated in FIG. 3.

The first pattern 220a and the second pattern 220b are disposed in different directions from each other. For example, the first direction may be an X-axis direction, and the second direction may be a Y-axis direction orthogonal to the first direction, but it is not limited thereto.

In this regard, the first and second patterns 220a and 220b are formed in the same layer of the substrate, and the respective patterns thereof have to be electrically connected with each other to detect the touched point. However, each unit patterns the first pattern 220a are connected with each other through connection parts thereof while unit patterns of the second pattern 220b are separated from each other in an island form, thereby additional bridge electrodes 230 are needed to electrically connect the unit patterns of second pattern 220b with each other.

Any transparent electrode material known in the related art may be used for the sensing pattern 220 without particular limitation thereof. For example, indium-tin oxide (ITO), indium-zinc oxide (IZO), zinc oxide (ZnO), indium-zinc-tin oxide (IZTO), cadmium-tin oxide (CTO), poly(3,4-ethylenedioxythiopene) (PEDOT), carbon nanotube (CNT), graphene, etc., may be used, which may be used alone or in combination of two or more thereof. Preferably, the indium-tin oxide (ITO) is used. Metals used in the metal wire are not particularly limited but may include, for example, silver (Ag), gold, aluminum, copper, iron, nickel, titanium, tellurium, chromium, etc., which are used alone or in combination of two or more thereof.

The bridge electrodes 230 electrically connect the separated unit patterns of the second pattern 220b.

The bridge electrode 230 may be made of the same material as the sensing pattern 220, and may be made of, for example, molybdenum, silver, aluminum, copper, palladium, gold, platinum, zinc, tin, titanium, or an alloy of two or more thereof.

The first pattern 220a and the second pattern 220b have to be insulated from each other, an insulation layer 240 is formed between the sensing pattern 220 and the bridge electrode 230.

As illustrated in FIG. 3, the insulation layer 240 may be formed only between a connection part of the first pattern 220a and the bridge electrode 230, and may be formed in a structure of a layer covering the sensing pattern 220. In a case of the layered structure, the bridge electrode 230 may connect the unit patterns of the second pattern 220b through contact holes foiled in the insulation layer 240.

In addition, the touch panel 200 may satisfy Equation 1 below:

$$(\text{Toughness of touch panel substrate/Stress applied to the touch panel during bending}) \geq 9\% \quad \text{[Equation 1]}$$

(wherein the stress is a stress applied to the touch panel when bending the flexible image display device with a radius of curvature of 2.5 mm at a speed of 40 times/minute at room temperature by repeating 300,000 times).

When the touch panel 200 satisfies Equation 1, it has excellent crack resistance against continuous bending fatigue.

As used herein, the term "room temperature" means the range of temperatures that people tend to prefer for indoor settings. The range is approximately between 15° C. (59° F.) and 30° C. (86° F.).

The polarizing plate 300 may be a configuration including a polarizer alone, or the polarizer and a protective film adhered to at least one surface thereof.

The polarizer may be any polarizer used in the related art, and for example, prepared by a process such as swelling, dying, cross-linking, drawing, washing, drying a polyvinyl alcohol film, or the like.

The protective film used herein may be any film so long as it has excellent properties such as transparency, mechanical strength, thermal stability, moisture-shielding properties, isotropic properties, or the like. In particular, polyester films such as polyethylene terephthalate, polyethylene isophthalate, polybutylene terephthalate, etc.; cellulose films such as diacetylocellulose, triacetylcellulose, etc.; polycarbonate films; acryl films such as polymethyl (meth)acrylate, polyethyl (meth)acrylate, etc.; styrene films such as polystyrene, acrylonitrile-styrene copolymer, etc.; polyolefin films such as cycloolefin, cycloolefin copolymer, polynorbornene, polypropylene, polyethylene, ethylene-propylene copolymer, etc.; vinyl chloride films; polyamides films such as nylon, aromatic polyamide, etc.; imide films; sulfone films; polyetherketone films; polyphenylene sulfide films; vinyl alcohol films; vinylidene chloride films; vinyl butyral films; allylate films; polyoxymethylene films; urethane films; epoxy films; silicon films, or the like, may be used. In particular, the cellulose film having a surface saponified using alkali or the like is preferably used among the above compounds, in consideration of polar properties or durability. The protective film may also have an optical compensation function such as a retardation function.

The protective film is adhered to one surface of the polarizer when using as the polarizing plate 300. In this case, adhesion facilitating treatment for improving adhesiveness may be executed on a surface to be adhered to the polarizer.

The adhesion facilitating treatment is not particularly limited so long as it can improve adhesiveness between the polarizer and the protective film, and may include drying treatment such as primer treatment, plasma treatment, corona treatment, etc.; chemical treatment such as alkalination (saponification) treatment; low pressure UV treatment, or the like.

The polarizing plate 300 may have an elastic modulus of 7 GPa or less. If the elastic modulus exceeds 7 GPa, flexibility thereof may be decreased. In terms of expressing an appropriate hardness or excellent flexibility, the polarizing plate may have an elastic modulus of 2 GPa to 7 GPa, and preferably 2 GPa to 5.5 GPa.

A thickness of the polarizing plate 300 is not particularly limited and may be, for example, 100 μm or less. If the thickness thereof exceeds 100 μm, flexibility thereof may be decreased. Within the above range, the polarizing plate may have a thickness of 5 μm to 100 μm, for example.

In the flexible image display device of the present invention, the window substrate 100 has a thickness thicker than a total thickness of the polarizing plate 300, the touch panel 200 and the display panel 400. In addition, the window substrate 100 may have an elastic modulus larger than an elastic modulus of a laminate of the polarizing plate 300, the touch panel 200 and the display panel 400. In this case, the flexible image display device may express excellent flexibility while reducing a thickness thereof, thus being preferable.

It is preferable that the flexible image display device of the present invention may have a thickness of 500 μm or less between an upper surface of the window substrate 100 and a lower surface of the display panel 400. For example, the thickness thereof may be 100 μm to 400 μm, but it is not limited thereto.

A distance between a neutral plane and a lower surface of the touch panel based on a visible side during bending is 34% or less to an entire thickness of the flexible image display device.

Figure 2:
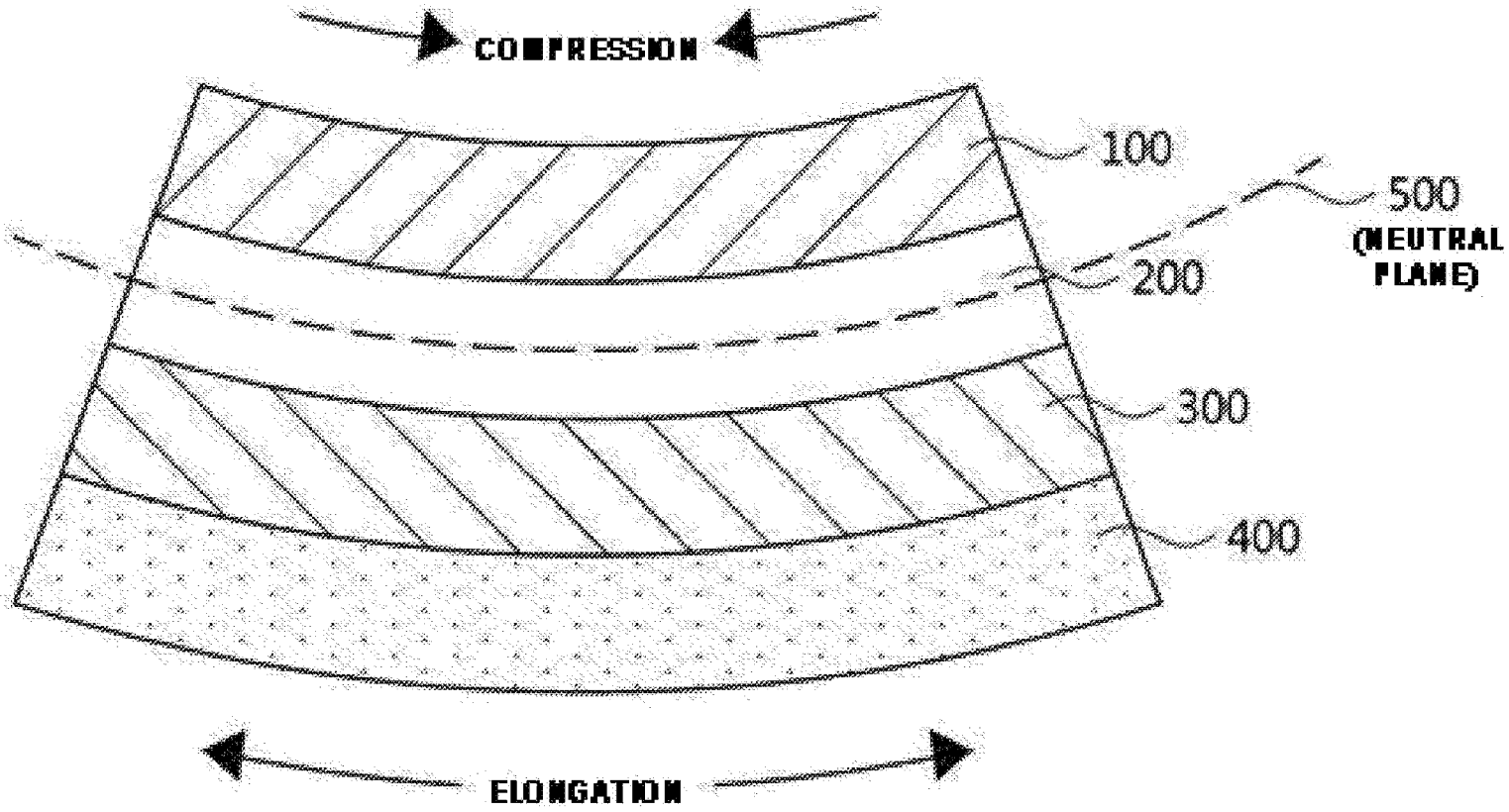
FIG. 2 is a schematic cross-sectional view of the flexible image display device according to the embodiment of the present invention during bending.

The neutral plane means a point in which no compressive stress or tensile stress acts during bending the flexible image display device. For example, when the flexible image display device is bent as illustrated in FIG. 2, the compressive stress acts on an inside of the curved curvature and the tensile stress acts on an outside thereof. Therefore, a direction in which the stress acts is gradually changed from the inside of the curvature toward the outside thereof, and at a critical point, there exists a transition point in which neither the compressive stress nor the tensile stress acts, and this transition point becomes the neutral plane (NP).

The tensile stress more greatly affects an occurrence of cracks than the compressive stress, and the largest tensile stress is applied to the lower surface of the touch panel 200. Accordingly, when the distance between the neutral plane and the lower surface of the touch panel 200 during bending is set so as to be 34% or less to the entire thickness of the flexible image display device, the stress applied to the touch panel 200 may be decreased to prevent an occurrence of cracks in the touch panel 200.

The position of the neutral plane may be changed according to the thickness, elastic modulus, etc. of each component included in the flexible image display device. Therefore, by controlling the thickness, elastic modulus, etc. of each component, or controlling the position of the touch panel 200 in the flexible image display device, the above-described distance may be controlled as necessary.

In the flexible image display device of the present invention, a lamination sequence of the polarizing plate 300 and the touch panel 200 is not particularly limited. The window substrate 100, the polarizing plate 300, the touch panel 200 and the display panel 400 may be laminated in this order, and the window substrate 100, the touch panel 200, the polarizing plate 300 and the display panel 400 may be laminated in this order.

When the window substrate 100, the polarizing plate 300, the touch panel 200 and the display panel 400 are laminated in this order, since the touch panel 200 is disposed on a lower side of the polarizing plate 300 based on the visible side, there is an advantage that the patterns of the touch panel 200 are not clearly viewed.

In this case, it is preferable that a substrate 210 of the touch panel 200 has a front retardation of ±2.5 nm or less. Such a material having the above-described range of the front retardation may include one or more of material selected from a group consisting of materials such as triacetylcellulose, diacetylocellulose, cycloolefin, cycloolefin copolymer, polynorbornene copolymer, or the like.

In order to express excellent flexibility while reducing the thickness of the flexible image display device, as described above, the window substrate 100 has a thickness thicker than a total thickness of the polarizing plate 300, the touch panel 200 and the display panel 400, and an elastic modulus larger than the elastic modulus of the laminate of the polarizing plate 300, the touch panel 200 and the display panel 400. In this case, the neutral plane is located close to the window substrate 100 of the flexible image display device.

Accordingly, when the window substrate 100, the touch panel 200, the polarizing plate 300 and the display panel 400 are laminated in this order, the touch panel 200 may be located closer to the neutral plane to minimize the damage of the touch panel 200.

The polarizing plate 300 and the touch panel 200 are disposed between the window substrate 100 and the display panel 400 by an optical clear adhesive (OCA) layer.

When the window substrate 100, the polarizing plate 300, the touch panel 200 and the display panel 400 are laminated in this order, the optical clear adhesive layers may be disposed between the window substrate 100 and the polarizing plate 300, and between the touch panel 200 and the display panel 400.

When the window substrate 100, the touch panel 200, the polarizing plate 300 and the display panel 400 are laminated in this order, the optical clear adhesive layers may be disposed between the window substrate 100 and the touch panel 200, bet ween the touch panel 200 and the polarizing plate 300, and between the polarizing plate 300 and the display panel 400.

A thickness of the optical clear adhesive layer is not particularly limited and may be, for example, 20 μm to 100 μm.

In the optical clear adhesive layer according to the present invention, a lower adhesive layer has a thickness or more of an upper adhesive layer, and preferably has a viscoelasticity of 0.2 MPa at −20° C. to 80° C. In this case, it is possible to reduce noise generated by an interference between the touch panel 200 and the display panel 400, and suppress failure of the upper and lower substrates by mitigating an interfacial stress during bending. In terms of suppressing a cohesive failure of an adhesive and mitigating the interfacial stress, more preferably, the optical clear adhesive layer has a viscoelasticity of 0.02 to 0.15 MPa.

An acryl adhesive layer may be further included between the polarizing plate 300 and the touch panel 200, and between the window substrate 100 and the display panel 400, other than the optical clear adhesive (OCA) layer.

Hereinafter, preferred embodiments arc proposed to more concretely describe the present invention. However, the following examples are only given for illustrating the present invention and those skilled in the related art will obviously understand that various alterations and modifications are possible within the scope and spirit of the present invention. Such alterations and modifications are duly included in the appended claims.

Example and Comparative Example

Flexible image display devices having configurations described in Table 1 below were prepared.

TABLE 1

| Comparative Example 1 | Comparative Example 2 | Example 1 | Example 2 | Example 3 | Example 4 | Example 5 | Example 6 |
|---|---|---|---|---|---|---|---|
| Window substrate 152 μm | Window substrate 152 μm | Window substrate 152 μm | Window substrate 152 μm | Window substrate 152 μm | Window substrate 152 μm | Window substrate 152 μm | Window substrate 152 μm |
| OCA layer 100 μm | OCA layer 85 μm | OCA layer 50 μm | OCA layer 50 μm | Touch panel 27 μm | Touch panel 27 μm | Touch panel 27 μm | OCA layer 50 μm |
| Polarizing plate 41 μm | Polarizing plate 41 μm | Polarizing plate 41 μm | Polarizing plate 41 μm | OCA layer 50 μm | OCA layer 50 μm | OCA layer 50 μm | Touch panel 27 μm |
| Touch panel 27 μm | Touch panel 27 μm | Touch panel 27 μm | Touch panel 27 μm | Polarizing plate 41 μm | Polarizing plate 41 μm | Polarizing plate 41 μm | Polarizing plate 41 μm |
| OCA layer 50 μm | OCA layer 80 μm | OCA layer 100 μm | OCA layer 100 μm | OCA layer 100 μm | OCA layer 100 μm | OCA layer 100 μm | OCA layer 100 μm |

TABLE 2

| Comparative Example 3 | Comparative Example 4 | Example 7 | Example 8 | Example 9 | Example 10 | Example 11 | Example 12 |
|---|---|---|---|---|---|---|---|
| Window substrate 152 μm | Window substrate 152 μm | Window substrate 152 μm | Window substrate 152 μm | Window substrate 152 μm | Window substrate 152 μm | Window substrate 152 μm | Window substrate 152 μm |
| OCA layer 100 μm | OCA layer 85 μm | OCA layer 50 μm | OCA layer 50 μm | Touch panel 27 μm | Touch panel 27 μm | Touch panel 27 μm | OCA layer 50 μm |
| Polarizing plate 41 μm | Polarizing plate 41 μm | Polarizing plate 41 μm | Polarizing plate 41 μm | OCA layer 50 μm | OCA layer 50 μm | OCA layer 50 μm | Touch panel 27 μm |
| Touch panel 27 μm | Touch panel 27 μm | Touch panel 27 μm | Touch panel 27 μm | Polarizing plate 41 μm | Polarizing plate 41 μm | Polarizing plate 41 μm | Polarizing plate 41 μm |
| OCA layer 50 μm | OCA layer 80 μm | OCA layer 100 μm | OCA layer 100 μm | OCA layer 100 μm | OCA layer 100 μm | OCA layer 100 μm | OCA layer 100 μm |
| Display panel 20 μm | Display panel 20 μm | Display panel 20 μm | Display panel 20 μm | Display panel 20 μm | Display panel 20 μm | Display panel 20 μm | Display panel 20 μm |

In particular, a polyimide substrate which includes a finger print-preventing layer and a hard coating layer sequentially laminated on one surface thereof and has an elastic modulus of 6 GPa was used as a window substrate, a silicon OCA layer having an elastic modulus of 0.1 MPa at −20° C. to 80° C. was used as an upper adhesive layer, a polarizing plate which includes a triacetylcellulose protective film, having a thickness of 20 μm adhered on both surfaces of a polyvinyl alcohol polarizer having a thickness of 7 μm, and has an elastic modulus of 4.5 GPa was used as a polarizing plate.

As a touch panel, a touch panel which includes an ITO sensing pattern having a thickness of 40 nm on a triacetylcellulose (TAC) and cycloolefin (COP) substrate (retardation of ±2.5 nm or less), and a polyethylene terephthalate (PET) substrate (retardation of 125 nm), an insulation layer having a thickness of 2 μm on the sensing pattern, and an ITO bridge pattern having a thickness of 170 nm on the insulation layer, and has an elastic modulus of 4.5 GPa was used.

A silicon OCA layer having an elastic modulus of 0.1 MPa at −20° C. to 80° C. was used as a lower adhesive layer, and a flexible OLED having an elastic modulus of 5.0 GPa was used as a display panel.

A portion in which the optical clear adhesive (OCA) layer is not present therebetween among the members of each layer includes an acryl adhesive layer having a thickness of 2.5 μm, respectively.

Experimental Example (1) Calculation of Neutral Plane

A neutral plane was calculated according Equations 2 and 3 below.

$$\sigma = \frac{E}{R} \cdot Z \qquad \text{[Equation 2]}$$

(wherein, σ is a stress applied during bending, E is Young's Modulus, R is a radius of curvature, and Z is a neutral plane).

$$Z = \frac{\sum_{i=1}^{n} E_i d_i^2 + 2\sum_{i=2}^{n}\left(E_i d_i \sum_{j=1}^{i-1} d_j\right)}{2\sum_{i=1}^{n} E_i d_i} \qquad \text{[Equation 3]}$$

(wherein, n is the number of layers, d is a thickness of individual layers, and E is Young's Modulus).

(2) Assessment of Touch Properties Before Bending

A test was performed using a capacitance tester, and the touch properties before bending were determined in such a manner that, if a gap difference in numerals of an entire node is less than 20%, it is determined to be good (OK), and if the gap difference in numerals of the entire node is 20% or more, it is determined to be not good (NG).

(3) Experiment for Repeated Bending Fatigue

An experiment for analysis of repeated bending fatigue was assessed using a folding tester (DLDMLH-FS, YUASA Co.) An adhesion sample had a size of 100 mm×10 mm, and the sample was mounted in the tester, then assessment was conducted with a radius of curvature of 2.5 R at a speed of 40 times/minute by repeating 250,000 times.

For assessment, the repeated bending fatigue was determined in such a manner that, if there is no crack and a touch operation is reliably performed, it is determined to be good (OK), and if cracks are confirmed and the touch operation is not performed, it is determined to be not good (NG).

In cases of Comparative Examples 3 and 4, and Examples 7 to 12 in the experiment, a polyimide film (that plays a role of a rear cover at the time of being actually applied to products) having a thickness of 50 μm was further adhered to a lower surface of the display panel using an acryl adhesive layer haying a thickness of 2.5 μm, and then the experiment was performed.

(4) Experiment for Ball Drop

A steel ball used in the test had a weight of 500 g, and a diameter (R) of 2 cm. The experiment was performed by dropping the steel ball from a height of 15 cm on the display device of the examples and comparative examples, and impact resistance was determined in such a manner that, if there is no crack and the touch operation is reliably performed, it is determined to be good (OK), and if cracks are confirmed and the touch operation is not performed, it is determined to be not good (NG).

(5) Assessment of Touch Properties

Touch properties were determined in such a manner that, if a gap difference between before and after of the bending assessment or the ball drop experiment is less than 20%, it is determined to be good (OK), and if the gap difference is 20% or more, it is determined to be not good (NG).

(6) Display Quality a* and b* values depending on a viewing angle were measured using DMS-803 (Instrument Systems).

The measured angle and evaluation standards are as follows:

θ; 0-60°/Φ; 0, 45, 90 and 135°, based on a main viewing angle of display panel

If each numeral of a* and b* is 7 or less, it is determined to be good (OK)

If each numeral of a* and b* is 10 or more, it is determined to be not good (NG)

If both of a* and b* are 0, a complete black anti-reflective function may be expressed without light leakage, thereby display quality is improved. When using a PET film as a touch substrate of the touch panel disposed on the lower side of the polarizing plate, black does not occur in the touch panel.

TABLE 3

| Section | Comparative Example 1 | Comparative Example 2 | Example 1 | Example 2 | Example 3 | Example 4 | Example 5 | Example 6 |
|---|---|---|---|---|---|---|---|---|
| Touch panel substrate | COP | COP | TAC | PET | COP | TAC | PET | PET |
| Toughness of touch panel substrate (MPa %) | 500 | 1300 | 2500 | 13855 | 2000 | 2500 | 13855 | 13855 |
| Total thickness (μm) (Thickness of acryl adhesive layer is omitted) | 370 | 385 | 370 | 370 | 370 | 370 | 370 | 370 |
| Distance between upper surface of window substrate and neutral plane (μm) | 146 | 127 | 123 | 123 | 117 | 118 | 119 | 125 |
| Distance between neutral plane and lower surface of touch panel (μm) | 152 | 161 | 125 | 125 | 42 | 41 | 40 | 82 |
| Distance between neutral plane and lower surface of display panel (μm) | 224 | 258 | 247 | 247 | 250 | 249 | 248 | 245 |
| Stress applied to touch panel (MPa) | 375 | 396 | 309 | 309 | 102 | 100 | 99 | 203 |
| Stress applied to touch panel substrate (MPa) | 571 | 205 | 307 | 311 | 93 | 113 | 131 | 221 |
| Tensile stress (MPa) | 0 | 0 | 0 | 0 | 0 | 0 | 0 | 0 |
| Toughness of touch panel substrate (MPa %)/Stress applied to touch panel (MPa) | 1% | 3% | 8% | 45% | 20% | 25% | 140% | 68% |
| Toughness of touch panel substrate (MPa %)/Stress applied to touch panel substrate (MPa) | 1% | 6% | 8% | 45% | 21% | 22% | 106% | 63% |
| Distance between the neutral plane and lower surface of touch panel based on visible side/Total thickness (%) | 41 | 42 | 34 | 34 | 11 | 11 | 11 | 22 |
| Touch properties before bending | OK | OK | OK | OK | OK | OK | OK | OK |
| Repeated bending fatigue | NG | NG | OK | OK | OK | OK | OK | OK |
| Ball drop | NG | NG | OK | OK | OK | OK | OK | OK |
| Touch properties | NG | NG | OK | OK | OK | OK | OK | OK |
| Display quality | OK | OK | OK | NG | OK | OK | OK | OK |

TABLE 4

| Section | Comparative Example 3 | Comparative Example 4 | Example 7 | Example 8 | Example 9 | Example 10 | Example 11 | Example 12 |
|---|---|---|---|---|---|---|---|---|
| Touch panel substrate | COP | COP | TAC | PET | COP | TAC | PET | PET |
| Toughness of touch panel substrate (MPa %) | 500 | 1300 | 2500 | 13855 | 2000 | 2500 | 13855 | 13855 |
| Total thickness (μm) (Thickness of acryl adhesive layer is omitted) | 390 | 405 | 390 | 390 | 390 | 390 | 390 | 390 |
| Distance between upper surface of window substrate and neutral plane (μm) | 162 | 147 | 141 | 141 | 136 | 137 | 137 | 143 |

TABLE 4-continued

| Section | Comparative Example 3 | Comparative Example 4 | Example 7 | Example 8 | Example 9 | Example 10 | Example 11 | Example 12 |
|---|---|---|---|---|---|---|---|---|
| Distance between neutral plane and lower surface of touch panel (μm) | 136 | 141 | 107 | 107 | 23.1 | 22.3 | 22.0 | 64 |
| Distance between neutral plane and lower surface of display panel (μm) | 228 | 258 | 249 | 249 | 251 | 250 | 250 | 247 |
| Stress applied to touch panel (MPa) | 336 | 347 | 264 | 264 | 57 | 55 | 54 | 158 |
| Stress applied to touch panel substrate (MPa) | 519 | 182 | 269 | 273 | 54 | 80 | 93 | 182 |
| Tensile stress (MPa) | 457 | 516 | 498 | 498 | 502 | 501 | 500 | 495 |
| Toughness of touch panel substrate (MPa %)/Stress applied to touch panel (MPa) | 1% | 4% | 9% | 53% | 35% | 45% | 256% | 88% |
| Toughness of touch panel substrate (MPa %)/Stress applied to touch panel substrate (MPa) | 1% | 7% | 9% | 51% | 37% | 31% | 149% | 76% |
| Distance between the neutral plane and lower surface of touch panel based on visible side/Total thickness (%) | 35 | 35 | 27 | 27 | 6 | 6 | 6 | 16 |
| Touch properties before bending | OK | OK | OK | OK | OK | OK | OK | OK |
| Repeated bending fatigue | NG | NG | OK | OK | OK | OK | OK | OK |
| Ball drop | NG | NG | OK | OK | OK | OK | OK | OK |
| Touch properties | NG | NG | OK | OK | OK | OK | OK | OK |
| Display quality | OK | OK | OK | NG | OK | OK | OK | OK |

As a result of the experiment, it could be seen that the flexible image display devices of the examples had a distance between the neutral plane and the lower surface of the touch panel based on the visible side during bending was 34% or less to an entire thickness of the flexible image display device, and exhibited no occurrence of cracks due to the repeated bending fatigue.

However, in a case of the flexible image display devices of the comparative examples, cracks occurred due to the repeated bending fatigue.

What is claimed is:

1. A flexible image display device comprising:

a window substrate;

a polarizing plate; [and]

a touch panel between the window substrate and the polarizing plate, wherein a distance between a neutral plane and a lower surface of the touch panel based on a visible side during bending is 34% or less to an entire thickness of the flexible image display device[.]*; and*

*a display panel disposed on a side opposite to the window substrate based on the polarizing plate and the touch panel,* wherein a substrate of the touch panel has a toughness of 2,000 MPa % or more*; and*

*the window substrate, the touch panel and the display panel have an elastic modulus of 2 GPa to 7 GPa, respectively, and the polarizing plate has an elastic modulus of 7 GPa or less.*

[2. The flexible image display device according to claim 1, further comprising a display panel disposed on a side opposite to the window substrate based on the polarizing plate and the touch panel.]

3. The flexible image display device according to claim [2] *1*, wherein a thickness between an upper surface of the window substrate and a lower surface of the display panel is 500 μm or less.

4. The flexible image display device according to claim [2] *1*, wherein the window substrate has a thickness thicker than a total thickness of the polarizing plate, the touch panel and the display panel, and an elastic modulus larger than an elastic modulus of a laminate of the polarizing plate, the touch panel and the display panel.

[5. The flexible image display device according to claim 2, wherein the window substrate, the touch panel and the display panel have an elastic modulus of 2 GPa to 7 GPa, respectively, and the polarizing plate has an elastic modulus of 7 GPa or less.]

[6. The flexible image display device according to claim 2, wherein optical clear adhesive layers are located between the window substrate and the polarizing plate, and between the touch panel and the display panel.]

[7. The flexible image display device according to claim 2, wherein the window substrate, the polarizing plate, the touch panel and the display panel are laminated in this order.]

[8. The flexible image display device according, to claim 7, wherein the substrate of the touch panel has a front retardation of ±2.5 nm or less.]

9. The flexible image display device according to claim [2] *1*, wherein the window substrate, the touch panel, the polarizing plate and the display panel are laminated in this order.

10. The flexible image display device according to claim 1, wherein the touch panel satisfies Equation 1 below:

$$(\text{Toughness of touch panel substrate/Stress applied to the touch panel during bending})>9\% \quad \text{[Equation 1]}$$

wherein the stress is a stress applied to the touch panel when bending the flexible image display device with a radius of curvature of 2.5 mm at a speed of 40 times/minute at room temperature by repeating 300,000 times.

*11. A flexible image display device comprising:*

*a window substrate;*

*a touch panel, wherein a distance between a neutral plane and a lower surface of the touch panel based on a*

*visible side during bending is 34% or less to an entire thickness of the flexible image display device, and a substrate of the touch panel has a toughness of 2,000 MPa % or more;*

*a polarizing plate between the window substrate and the touch panel; and*

*a display panel disposed on a side opposite to the window substrate based on the polarizing plate and the touch panel,*

*wherein a thickness between an upper surface of the window substrate and a lower surface of the display panel is 500 μm or less.*

*12. The flexible image display device according to claim 11, wherein the window substrate has a thickness thicker than a total thickness of the polarizing plate, the touch panel and the display panel, and an elastic modulus larger than an elastic modulus of a laminate of the polarizing plate, the touch panel and the display panel.*

*13. The flexible image display device according to claim 11, wherein the window substrate, the touch panel and the display panel have an elastic modulus of 2 GPa to 7 GPa, respectively, and the polarizing plate has an elastic modulus of 7 GPa or less.*

*14. The flexible image display device according to claim 11, wherein optical clear adhesive layers are located between the window substrate and the polarizing plate, and between the touch panel and the display panel.*

*15. The flexible image display device according to claim 11, wherein the window substrate, the polarizing plate, the touch panel and the display panel are laminated in this order.*

*16. The flexible image display device according to claim 15, wherein the substrate of the touch panel has a front retardation of ±2.5 nm or less.*

*17. The flexible image display device according to claim 11, wherein the touch panel satisfies Equation 1 below:*

$$(\text{Toughness of touch panel substrate}/\text{Stress applied to the touch panel during bending}) > 9\% \quad [\text{Equation 1}]$$

*wherein the stress is a stress applied to the touch panel when bending the flexible image display device with a radius of curvature of 2.5 mm at a speed of 40 times/minute at room temperature by repeating 300,000 times.*

* * * * *